US011270950B2

(12) United States Patent
Liu et al.

(10) Patent No.: US 11,270,950 B2
(45) Date of Patent: Mar. 8, 2022

(54) APPARATUS AND METHOD FOR FORMING ALIGNMENT MARKS

(71) Applicant: Taiwan Semiconductor Manufacturing Co., Ltd., Hsinchu (TW)

(72) Inventors: Yen-Chen Liu, Hsinchu (TW);
Cheng-Hao Yu, Hsinchu (TW);
Cheng-Yi Huang, Hsinchu (TW);
Chao-Li Shih, Hsinchu County (TW);
Chih-Shen Yang, Yunlin County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 3 days.

(21) Appl. No.: 16/805,837

(22) Filed: Mar. 2, 2020

(65) Prior Publication Data
US 2021/0098390 A1     Apr. 1, 2021

Related U.S. Application Data

(60) Provisional application No. 62/906,747, filed on Sep. 27, 2019.

(51) Int. Cl.
*H01L 23/544*     (2006.01)
*H01L 21/268*     (2006.01)
(Continued)

(52) U.S. Cl.
CPC ........ *H01L 23/544* (2013.01); *G02B 27/0927* (2013.01); *G02B 27/0944* (2013.01);
(Continued)

(58) Field of Classification Search
CPC ............ G02B 27/0927; G02B 27/0944; G02B 27/106; G02B 27/1093; H01L 21/268;
(Continued)

(56) References Cited

U.S. PATENT DOCUMENTS 6,156,676 A * 12/2000 Sato ................ H01L 21/67282
                                                    438/228
7,220,655 B1 * 5/2007 Hause .................. G03F 9/7076
                                                    257/E23.179

(Continued)

FOREIGN PATENT DOCUMENTS

CN      105050764        11/2015
JP      2002118055       4/2002
(Continued)

OTHER PUBLICATIONS

Office Action of Deutsches Counterpart Application, dated Mar. 9, 2021, pp. 1-6.
(Continued)

*Primary Examiner* — Duy T Nguyen
(74) *Attorney, Agent, or Firm* — JCIPRNET

(57) ABSTRACT

An apparatus and a method for forming alignment marks are disclosed. The method for forming alignment marks is a photolithography-free process and includes the following operations. A laser beam is provided. The laser beam is divided into a plurality of laser beams separated from each other. The plurality of laser beams is shaped into a plurality of patterned beams, so that the plurality of patterned beams is shaped with patterns corresponding to alignment marks. The plurality of patterned beams is projected onto a semiconductor wafer.

20 Claims, 7 Drawing Sheets

(51) Int. Cl.
*G02B 27/09* (2006.01)
*G02B 27/10* (2006.01)

(52) U.S. Cl.
CPC ....... *G02B 27/106* (2013.01); *G02B 27/1093* (2013.01); *H01L 21/268* (2013.01); *H01L 2223/5442* (2013.01); *H01L 2223/54426* (2013.01)

(58) Field of Classification Search
CPC ... H01L 2223/5442; H01L 2223/54426; H01L 2223/5446; H01L 23/544; H01L 21/67282; H01L 21/02057; H01L 21/682; B23K 26/066; B23K 26/067; G03F 1/42; G03F 9/708
USPC .......................................................... 438/795
See application file for complete search history.

(56) References Cited

U.S. PATENT DOCUMENTS

| | | | |
|---|---|---|---|
| 7,812,972 | B2 | 10/2010 | Sato et al. |
| 2002/0182518 | A1 | 12/2002 | Van Haren |
| 2004/0179190 | A1* | 9/2004 | Miyashita ............... G03F 7/706 356/124 |
| 2008/0218714 | A1* | 9/2008 | Uehara ............... G03F 7/70341 355/53 |
| 2010/0015397 | A1 | 1/2010 | Allott |
| 2011/0031655 | A1 | 2/2011 | Toth et al. |
| 2016/0284904 | A1* | 9/2016 | Brunton ............... B23K 26/402 |
| 2019/0163074 | A1* | 5/2019 | Lan ..................... G03F 7/70591 |

FOREIGN PATENT DOCUMENTS

| | | |
|---|---|---|
| JP | 2011040747 | 2/2011 |
| KR | 20020090134 | 11/2002 |
| KR | 20060114846 | 11/2006 |
| KR | 100782769 | 12/2007 |
| KR | 2014130294 | * 11/2014 |
| KR | 20150131389 | 11/2015 |
| TW | I277842 | 4/2007 |
| TW | I282909 | 6/2007 |
| TW | 201006598 | 2/2010 |
| TW | 201905587 | 2/2019 |
| TW | 201937313 | 9/2019 |
| WO | 2014147375 | 9/2014 |

OTHER PUBLICATIONS

"Office Action of Taiwan Counterpart Application", dated Aug. 4, 2021, p. 1-p. 4.
"Office Action of Korea Counterpart Application", dated Nov. 5, 2021, pp. 1-7.

* cited by examiner

APPARATUS AND METHOD FOR FORMING ALIGNMENT MARKS

CROSS-REFERENCE TO RELATED APPLICATION

This application claims the priority benefit of U.S. provisional application Ser. No. 62/906,747, filed on Sep. 27, 2019. The entirety of the above-mentioned patent application is hereby incorporated by reference herein and made a part of this specification.

BACKGROUND

Semiconductor manufacturing involves thousands of processes. A photolithography process involves accurately transferring a mask pattern on a mask plate onto a semiconductor wafer. Aligning the mask plate with the semiconductor wafer, including calculating the position of the mask plate with respect to the semiconductor wafer, is used to achieve overlay accuracy. Alignment in photolithography processes is generally accomplished through use of mark alignment. In mark alignment, the first pattern layer has alignment marks disposed therein, and subsequently formed layers are aligned to the first layer by aligning to the alignment marks.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
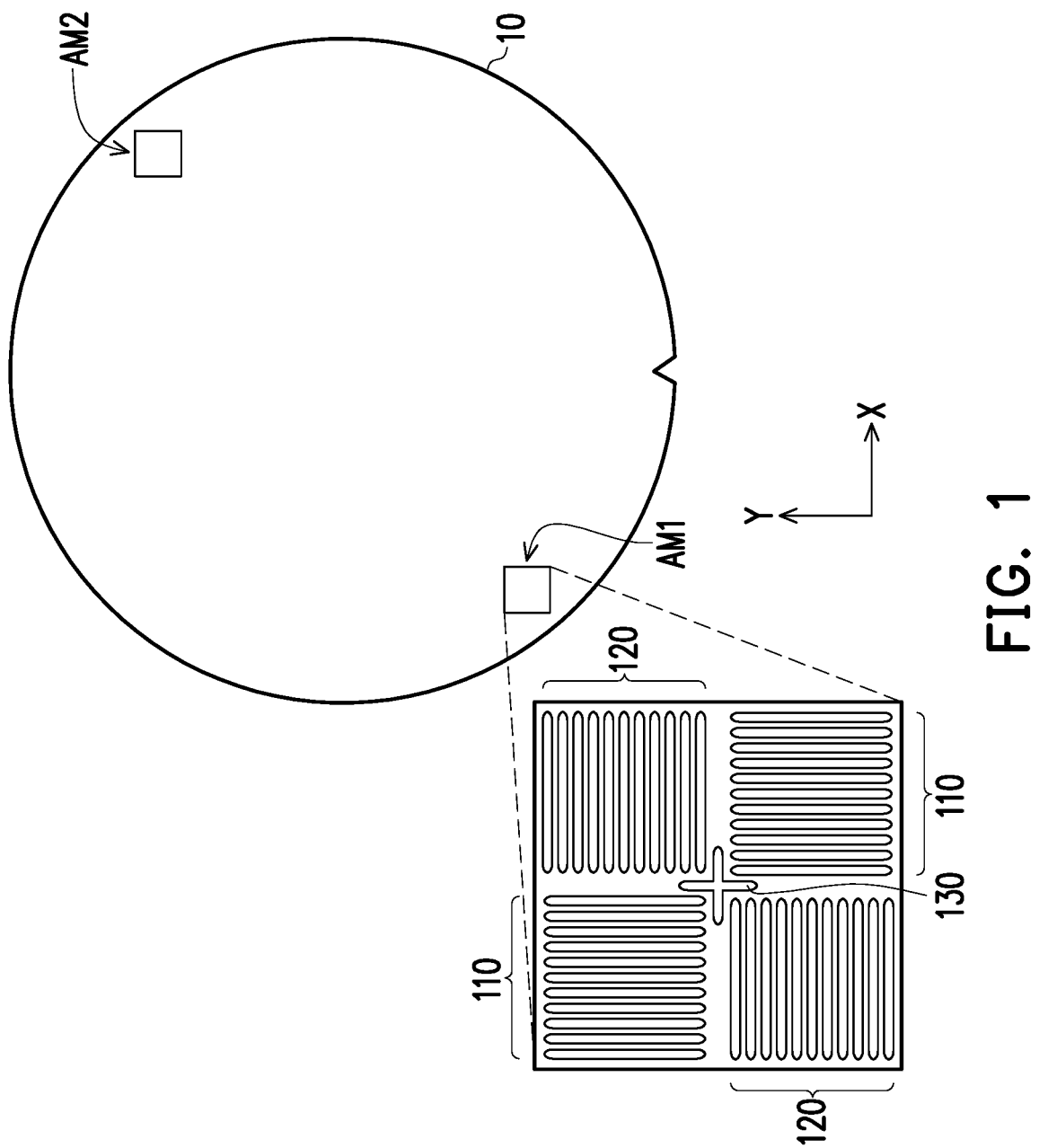
FIG. 1 is a schematic top view of a semiconductor wafer with alignment marks in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or step in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, an apparatus and a method for forming alignment marks with a photolithography-free process. Embodiments discussed herein provide examples to enable making or using the subject matter of this disclosure, and a person having ordinary skill in the art will readily understand modifications that can be made while remaining within contemplated scopes of different embodiments. Like reference numerals and characters in the figures below refer to like components. Although method embodiments may be discussed as being performed in a particular order, other method embodiments may be performed in any logical order.

FIG. 1 is a schematic top view of a semiconductor wafer with alignment marks in accordance with some embodiments. Referring to FIG. 1, a semiconductor wafer (or a substrate) 10 is shown, and the semiconductor wafer 10 has a first alignment mark AM1 and a second alignment mark AM2 formed therein. In some embodiments, the first alignment mark AM1 and the second alignment mark AM2 may be disposed on a peripheral region of the semiconductor wafer 10. In some embodiments, the first alignment mark AM1 and the second alignment mark AM2 are diagonally symmetrical to a center of the semiconductor wafer 10; that is, the first alignment mark AM1 and the second alignment mark AM2 are disposed at opposite sides with respect to the center of the semiconductor wafer 10. In other embodiments, the first alignment mark AM1 and the second alignment mark AM2 are disposed at different positions (rather than the opposite sides with respect to the center of the semiconductor wafer 10). However, the present disclosure is not limited thereto. In some embodiments, the first alignment mark AM1 and the second alignment mark AM2 are disposed on other regions of the semiconductor wafer 10, such as scribe lines. Although two alignment marks AM1 and AM2 are illustrated in FIG. 1, in some embodiments, the semiconductor wafer 10 has more than two alignment marks, and the number of the alignment marks is not limited.

In accordance with some embodiments, the semiconductor wafer 10 includes a crystalline silicon substrate. In accordance with other embodiments, the semiconductor wafer 10 includes an elementary semiconductor substrate such as germanium; a compound semiconductor substrate including silicon carbon, gallium arsenic, gallium phosphide, indium phosphide, indium arsenide, and/or indium antimonide; an alloy semiconductor substrate including SiGe, GaAsP, AlInAs, AlGaAs, GaInAs, GaInP, and/or GaInAsP; or combinations thereof. Other semiconductor substrates such as multi-layered or gradient substrates may also be used as a semiconductor wafer 10.

The first alignment mark AM1 is shown enlarged in FIG. 1 as indicated by dashed lines. In some embodiments, the first alignment mark AM1 and the second alignment mark AM2 have substantially the same patterns. In some embodiments, the first alignment mark AM1 and the second alignment mark AM2 have different patterns. In some embodiments, each of the first alignment mark AM1 and the second alignment mark AM2 are composed of four groups of alignment lines in a square. Each of the first alignment mark AM1 and the second alignment mark AM2 include two sets of first alignment lines 110 arranged in a first direction (e.g., Y direction) and two sets of second alignment lines 120 arranged in a second direction (e.g., X direction), wherein the first direction (e.g., Y direction) is different from (e.g., perpendicular to) the second direction (e.g., X direction). In some embodiments, the two sets of first alignment lines 110 arranged in the first direction are disposed diagonally symmetrical relative to a central pattern 130, and the two sets of second alignment lines 120 arranged in the second direction are disposed diagonally symmetrical relative to the central pattern 130. In some embodiments, the two sets of first alignment lines 110 arranged in the first direction and the two sets of second alignment lines 120 arranged in the second direction are used to achieve alignment in the first direction and the second direction, respectively.

In some embodiments, the first alignment lines 110 are not intersected with one another, and the second alignment lines 120 are not intersected with one another. In some embodiments, the first alignment lines 110 are substantially parallel to each other, and the second alignment lines 120 are substantially parallel to each other. In some embodiments, the first alignment lines 110 have substantially the same width and are arranged at substantially equal intervals, and the second alignment lines 120 have substantially the same width and are arranged at substantially equal intervals. In some embodiments, the widths and intervals of the first alignment lines 110 or the second alignment lines 120 are varied as needed.

In some embodiments, the central pattern 130 is a cross-shaped pattern located at a center of the alignment mark. In some embodiments, the central pattern 130 is a visual central point or has a different shape other than the cross shape, such as a dot pattern or a square pattern.

Figure 2:
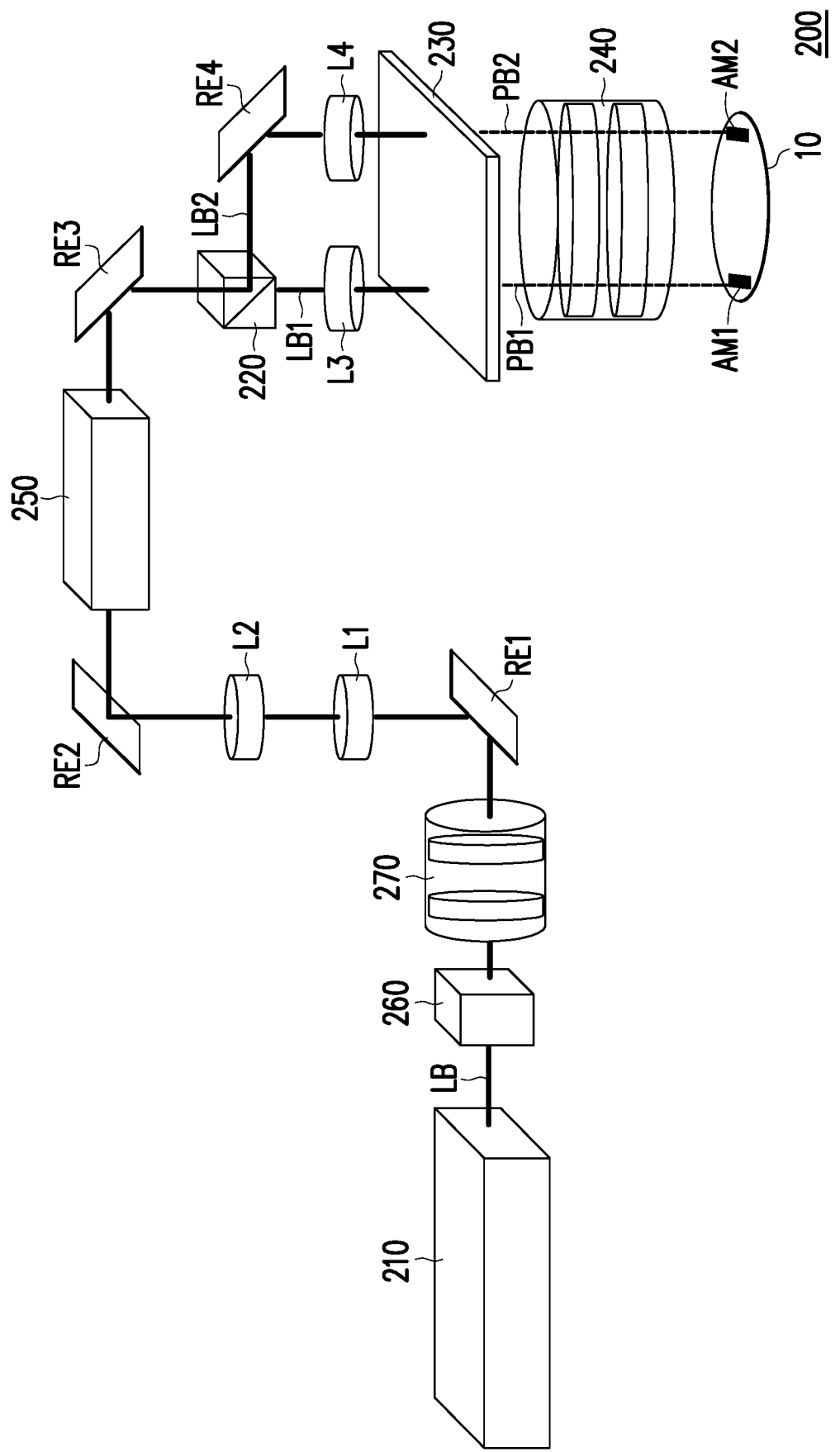
FIG. 2 is a schematic perspective view of an apparatus for forming alignment marks in accordance with some embodiments.

FIG. 2 is a schematic perspective view of an apparatus for forming alignment marks in accordance with some embodiments. Referring to FIG. 2, an apparatus 200 is provided to form alignment marks AM1 and AM2 onto a semiconductor wafer 10. In some embodiments, the apparatus 200 includes a light source 210, a beam splitting element 220, a pattern shaping element 230 and a projection lens 240. In some embodiments, the light source 210 is configured to emit a laser beam LB.

In some embodiments, the beam splitting element 220 is disposed on a transmission path of the laser beam LB, and is disposed on a light propagation path between the light source 210 and the pattern shaping element 230. In some embodiments, the beam splitting element 220 is configured to divide the laser beam LB into a plurality of laser beams separated from each other. In some embodiments, the beam splitting element 220 is configured to divide the laser beam LB into at least the first laser beam LB1 and the second laser beam LB2.

In some embodiments, the pattern shaping element 230 is disposed on transmission paths of the plurality of laser beams, such as the first laser beam LB1 and the second laser beam LB2, and is disposed on a light propagation path between the beam splitting element 220 and the projection lens 240. In some embodiments, the pattern shaping element 230 is configured to shape the first laser beam LB1 and the second laser beam LB2 into a first patterned beam PB1 and a second patterned beam PB2.

In some embodiments, the projection lens 240 is disposed on transmission paths of the plurality of patterned beams, such as the first patterned beam PB1 and the second patterned beam PB2, and is disposed on a light propagation path between the pattern shaping element 230 and the semiconductor wafer 10. In some embodiments, the projection lens 240 is configured to project the plurality of patterned beams onto the semiconductor wafer 10 to form directly a plurality of alignment marks, such as first alignment mark AM1 and second alignment mark AM2 shown in FIG. 1.

Grooves G (shown in FIG. 5A and FIG. 5B) are formed when the first patterned beam PB1 and the second patterned beam PB2 are irradiated onto the semiconductor wafer 10. The first patterned beam PB1 and the second patterned beam PB2 ablate or melt the semiconductor wafer 10 simultaneously to form the grooves G directly. In some embodiments, the plurality of grooves G extends from a top surface 10a (shown in FIG. 5A and FIG. 5B) of the semiconductor wafer 10 toward the interior of the semiconductor wafer 10. In some embodiments, the grooves G define the first alignment lines 110, the second alignment lines 120 and the central pattern 130 of each of the first alignment mark AM1 and the second alignment mark AM2 in the semiconductor wafer 10.

The first alignment mark AM1 and the second alignment mark AM2 are directly formed by a single laser process. As such, a photolithography process which includes various procedures such as photoresist coating, baking, exposing and developing operations, as well as etching and cleaning processes, for forming the alignment marks is not required. The forming method of the alignment marks in accordance with some embodiments of the disclosure does not involve the costly and time-consuming photolithography process. The method of forming the alignment marks of the disclosure is referred to as a "photolithography-free" or "chemical-free" process in some examples. The chemical-free process is a process in which etching solutions or etching gases are not used. As a result, the manufacturing process of the alignment marks is simplified and the manufacturing cost is reduced.

In some embodiments, the light source 210 includes an excimer laser at 308 nm, for example. In some embodiments, the laser beam LB has a laser energy density of greater than or equal to about 18 J/cm$^2$. The disclosure does not limit the wavelength of the light source and/or the laser energy density, as long as the first patterned beam PB1 and the second patterned beam PB2 formed from the laser beam LB are able to melt the semiconductor wafer 10 for forming the alignment marks AM1 and AM2.

In some embodiments, the beam splitting element 220 allows a portion of laser beam LB to pass through and reflect the other portion of the laser beam LB, so as to form the first laser beam LB1 and the second laser beam LB2 that are separated from each other and travel in different directions. In some embodiments, the beam splitting element 220 allows half of the laser beam LB to pass through and reflects half of the laser beam LB, so that a light intensity of the first laser beam LB1 is substantially equal to a light intensity of the second laser beam LB2. In some embodiments, the beam splitting element 220 includes a beam splitter made from two prisms. In some embodiments, the beam splitting element 220 includes a beam splitter made from a sheet of glass with an optical coating. In some embodiments, the beam splitting element 220 includes more than one beam splitter, and each beam splitter splits an incident beam into two components, so that the beam splitting element 220 divides the laser beam LB into more than two laser beams for forming more than two alignment marks. Embodiments in which the beam splitting element 220 includes one or more other optical elements capable of splitting the incident beam into a plurality of components is also contemplated herein.

In some embodiments, the pattern shaping element 230 shapes the first laser beam LB1 and the second laser beam LB2 into the first patterned beam PB1 and the second patterned beam PB2 respectively, and the first patterned beam PB1 and the second patterned beam PB2 are shaped with patterns corresponding to the first alignment mark AM1 and the second alignment mark AM2. In some embodiments, the pattern shaping element 230 includes a diffractive optical element (DOE), and the diffractive optical element has specially-designed microstructures to achieve specific patterns of the first patterned beam PB1 and the second patterned beam PB2. In some embodiments, a diffractive optical element including a multi-level diffraction grating such as 16 levels or more levels is used to serve as the pattern shaping element 230. In some embodiments, the pattern shaping element 230 includes a reticle, and the reticle includes patterns thereon corresponding to the first alignment mark AM1 and the second alignment mark AM2. It is noted that the patterns of the first patterned beam PB1 or the second patterned beam PB2 refer to the patterns of light spots of the first patterned beam PB1 or the second patterned beam PB2. In some embodiments, the patterns of the first patterned beam PB1 are the same as the patterns of second patterned beam PB2. In some alternative embodiments, the patterns of the first patterned beam PB1 are different from the patterns of second patterned beam PB2.

In some embodiments, the projection lens 240 includes one or more optical lenses having diopter. The disclosure does not construe the kind of the projection lens 240, as long as the first patterned beam PB1 and the second patterned beam PB2 are able to be projected onto the desired positions of the semiconductor wafer 10 through the projection lens 240 for forming the alignment marks AM1, AM2.

Figure 3A:
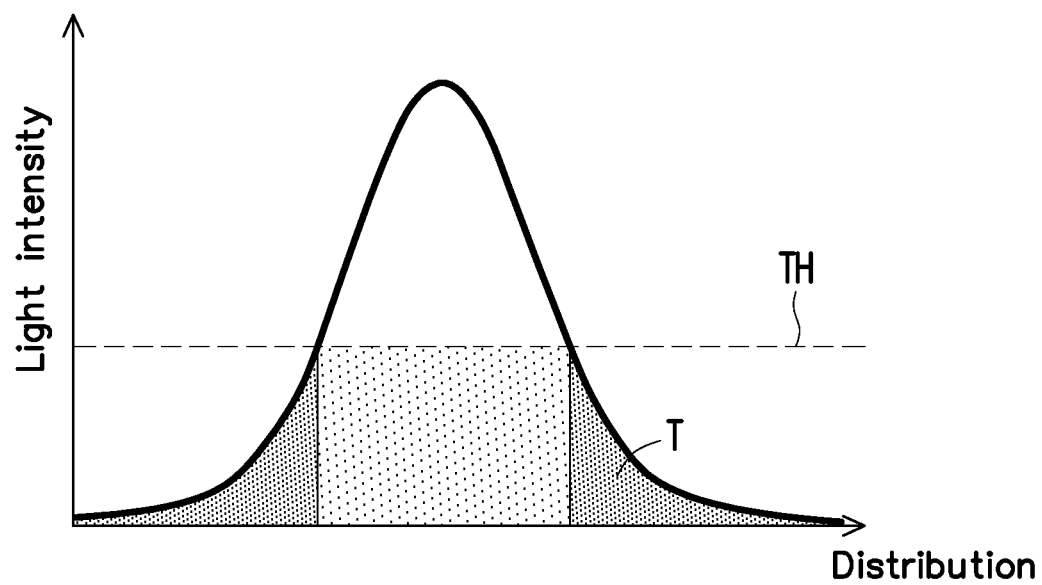
FIG. 3A and FIG. 3B illustrate light intensity distributions of a laser beam in accordance with some embodiments.
Figure 3B:
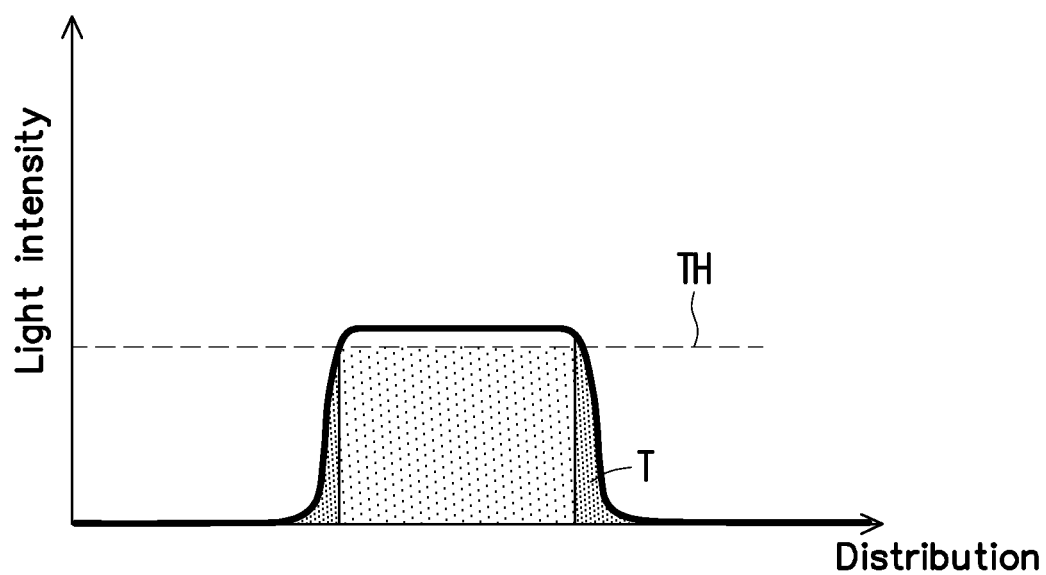

FIG. 3A and FIG. 3B illustrate light intensity distributions of a laser beam in accordance with some embodiments, in which the highest light intensity corresponds to a central region of a light spot of the laser beam, and the lowest light intensity corresponds to a peripheral region of the light spot of the laser beam. Referring to FIG. 2, FIG. 3A and FIG. 3B, in some embodiments, the apparatus 200 further includes a homogenizer 250. In some embodiments, the homogenizer 250 is disposed on a light propagation path between the light source 210 and the beam splitting element 220.

In some embodiments, the laser beam LB emitted from the light source 210 has a light intensity distribution similar to a Gaussian distribution, as shown in FIG. 3A. The light intensity of the Gaussian-like distribution is higher at a center and lower on two sides. In some embodiments, the laser beam LB emitted from the light source 210 has a non-uniform light intensity distribution with two long and extended tails T on two sides for each light spot of the laser beam. The long and extended tails T of the Gaussian-like distribution have a light intensity slightly lower than the ablation threshold intensity TH for melting the semiconductor wafer 10. Such long and extended tails T of the original laser beam LB cause the profile of the formed grooves of the alignment marks to greatly deviate from the intended shape, dimension or roughness. The formed alignment marks may be damaged and fail to provide an alignment function.

In some embodiments, the homogenizer 250 is configured to homogenize (or uniformize) the laser beam LB. When the laser beam LB passes through the homogenizer 250, the laser beam LB is homogenized, so that the light intensity distribution of the laser beam LB may be transformed into a top-hat distribution, as shown in FIG. 3B. The top-hat distribution has substantially uniform light intensity for each light spot of the laser beam. After the laser beam LB is homogenized by the homogenizer 250, the light spot of the homogenized laser beam has a light intensity distribution similar to a top-hat distribution, as shown in FIG. 3B. The top-hat distribution may have a substantially uniform light intensity distribution with two rapidly decaying tails T on two side of each light spot of the laser beam. The substantially uniform light intensity of the top-hat distribution is higher than the ablation threshold intensity TH for melting the semiconductor wafer 10. The short tails T of the top-hat distribution have a light intensity much lower than the ablation threshold intensity TH for melting the semiconductor wafer 10. Such short and weak tails T of the light intensity distribution may cause the profile of the grooves of the alignment marks AM1, AM2 to be slightly rounded at the ends and/or slightly rough on the sidewalls, which is discussed in the description related to FIG. 4 and FIGS. 5A-5B. The formed alignment marks are capable of providing an alignment function.

The light intensity distribution of the laser beam LB becomes uniform after passing through the homogenizer 250. As such, the undesired profile and bottom damage of the grooves G of the first alignment mark AM1 and the second alignment mark AM2 are reduced, and the process window for forming the alignment marks AM1 and AM2 is increased accordingly. In some embodiments, the homogenizer 250 includes a rod integrator. In some embodiments, the homogenizer 250 is arranged along an optical axis of the laser beam LB. In some embodiments, the homogenizer 250 has a rectangular light entrance surface and a rectangular light exit surface. After the incident laser beam LB enters the light entrance surface of the homogenizer 250, multiple reflections of the laser beam LB may occur in the homogenizer 250 to obtain the homogenization of the laser beam LB. In some embodiments, the reflections are total internal reflections. In some embodiments, the homogenizer 250 includes a diffractive optical element (DOE).

In some embodiments, the apparatus 200 further includes one or more optical elements to achieve specific optical functions. In some embodiments, the apparatus 200 further includes an optical isolator 260, a beam expander 270, reflecting elements RE1, RE2, RE3 and RE4 and/or lenses L1, L2, L3 and L4. In some embodiments, the optical isolator 260 is disposed between the light source 210 and the beam expander 270. In some embodiments, the optical isolator 260 is configured to allow the transmission of the laser beam LB in only one direction so as to prevent a portion of the laser beam LB from returning back to the light source 210. In some embodiments, the beam expander 270 is disposed on a light propagation path between the optical isolator 260 and the homogenizer 250. In some embodiments, the beam expander 270 is configured to expand the laser beam LB, such that the laser beam LB is transformed from a point light into a surface light. After the laser beam LB passes through the beam expander 270, the width of the laser beam LB becomes wider, and the area of light spot of the laser beam LB becomes larger. In some embodiments, the beam expander 270 is coated with anti-reflecting coatings to reduce optical loss.

In some embodiments, the reflecting elements RE1, RE2, RE3 and RE4 are configured to adjust the light path of the laser beam LB, the first laser beam LB1 or the second laser beam LB2. For example, the reflecting elements RE1 and RE2 transmit (reflect) the laser beam LB coming from the beam expander 270 to the homogenizer 250, and the reflecting element RE3 transmit (reflect) the laser beam LB coming from the homogenizer 250 to the beam splitting element 220. The reflecting element RE4 may redirect the second laser beam LB2 coming from the beam splitting element 220 and transmit (reflect) the second laser beam LB2 to the pattern shaping element 230, so that the second laser beam LB2 may travel in the same direction as the first laser beam LB1. In some embodiments, the lenses L1 and L2 between the reflecting elements RE1 and RE2, the lens L3 between the beam splitting element 220 and the pattern shaping element 230, and the lens L4 between the reflecting element RE4 and the pattern shaping element 230 are configured to converge or collimate the laser beam LB, the first laser beam LB1 and the second laser beam LB2, respectively. In some embodiments, the beam expander 270, the pattern shaping element 230 and/or the semiconductor wafer 10 are disposed on the focal planes of the apparatus 200.

Figure 4:
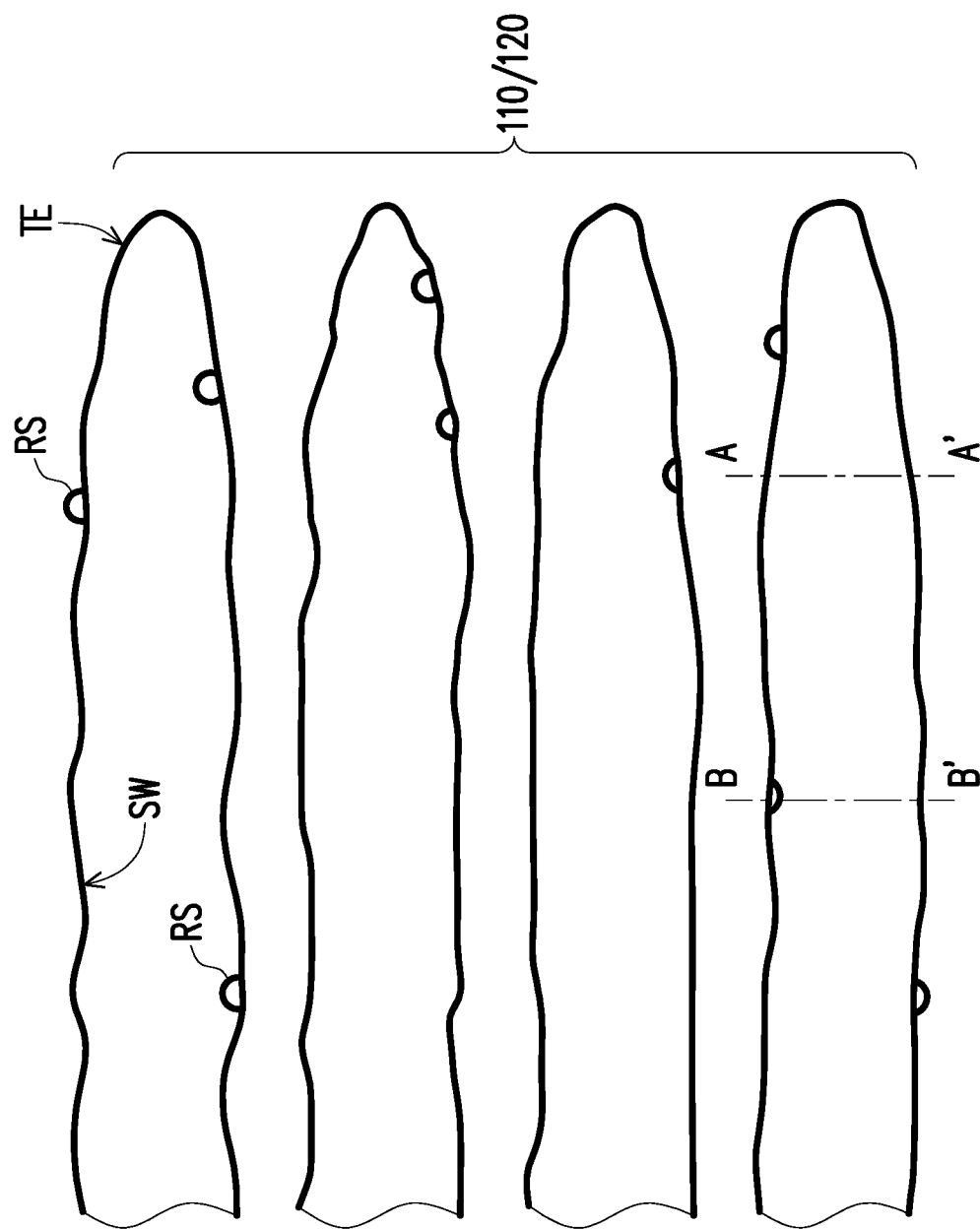
FIG. 4 is a partial enlarged view of an alignment mark in accordance with some embodiments.
Figure 5A:
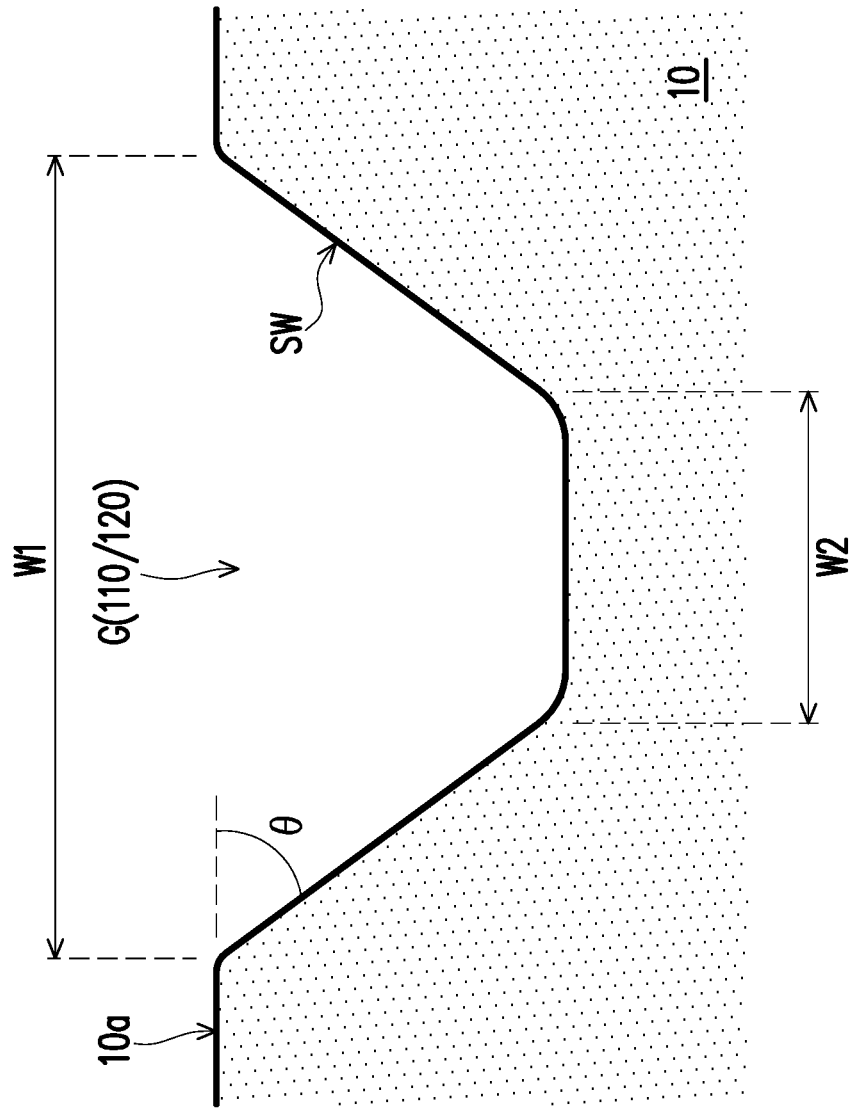
FIG. 5A and FIG. 5B are schematic cross-sectional views of an alignment mark respectively taken along an A-A' line and a B-B' line illustrated in FIG. 4 in accordance with some embodiments.
Figure 5B:
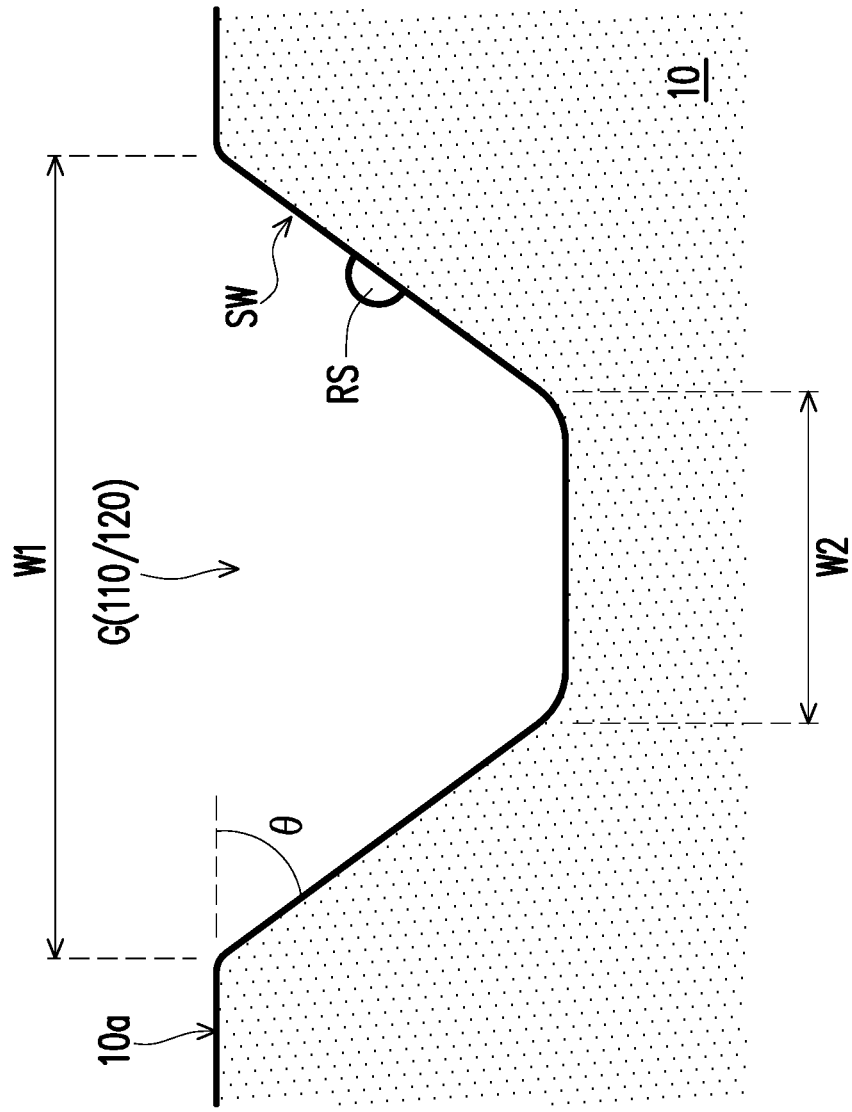

FIG. 4 is a partial enlarged view of an alignment mark in accordance with some embodiments. FIG. 5A and FIG. 5B are schematic cross-sectional views of an alignment mark respectively taken along an A-A' line and a B-B' line illustrated in FIG. 4 in accordance with some embodiments. As shown in FIG. 4, in some embodiments, since the first and second alignment marks AM1, AM2 are formed by the aforementioned laser process, the first and second alignment lines 110, 120 of the first and second alignment marks AM1, AM2 may have tapered ends TE, and the first and second alignment lines 110, 120 of the first and second alignment marks AM1, AM2 may have residues RS protruding from sidewalls SW thereof. In some embodiments, a width of the central portion of one first alignment line 110 or second alignment line 120 is wider than a width of the tapered end TE of the same first alignment line 110 or second alignment line 120. In some embodiments, a pump (not shown) is provided to remove by-products of the laser ablation from the semiconductor wafer 10. In some embodiments, the residues RS remain on the top surface of the semiconductor wafer 10. The residues RS may remain on the top surface and/or the sidewall of at least one of the first alignment lines 110 or second alignment lines 120. It is noted that, although some residues RS exist, these residues RS are generally too small to impact the alignment function of the first and second alignment marks AM1, AM2. In some embodiments, the sidewalls SW of the first and second alignment lines 110, 120 of the first and second alignment marks AM1, AM2 are provided with a surface roughness Rz ranging from about 2 nm to about 50 nm. In some embodiments, the surface roughness Rz is calculated by measuring the vertical distance from the highest peak to the lowest valley within a predetermined sampling length or area.

As shown in FIG. 5A and FIG. 5B, in some embodiments, the first and second alignment lines 110, 120 of the first and second alignment marks AM1, AM2 have inclined sidewalls SW in the grooves G. In some embodiments, the top width W1 is larger than the bottom width W2 of each of the first and second alignment lines 110, 120. In some embodiments, the included angle θ is an acute angle between the inclined sidewall SW and the top surface 10a of the semiconductor wafer 10. In some embodiments, the included angle θ between each of the first and second alignment lines 110, 120 and the substrate 10 is in a range of about 30 degrees to about 75 degrees. In some embodiments, the included angle θ between each of the first and second alignment lines 110, 120 and the substrate 10 is about 30 degrees, 35 degrees, 40 degrees, 45 degrees, 50 degrees, 55 degrees, 60 degrees, 65 degrees, 70 degrees, 75 degrees, any range between any two of the preceding values, or any range less than any one of the preceding values. In the disclosure, with the "photolithography-free" or "chemical-free" process described above, each alignment line of the alignment mark formed with such angle range (30-75 degrees) is capable of meeting the process requirements, and the manufacturing process is simplified and the manufacturing cost is reduced.

In the cross-sectional view, the inclined sidewall SW at a position proximal to the top and/or bottom of at least one of the first and second alignment lines 110, 120 may be curved or rounded. In some embodiments, at least one groove G between adjacent first alignment lines 110 or second alignment lines 120 has a rounded bottom corner between the inclined sidewall SW and the top surface 10a of the semiconductor wafer 10.

Figure 6:
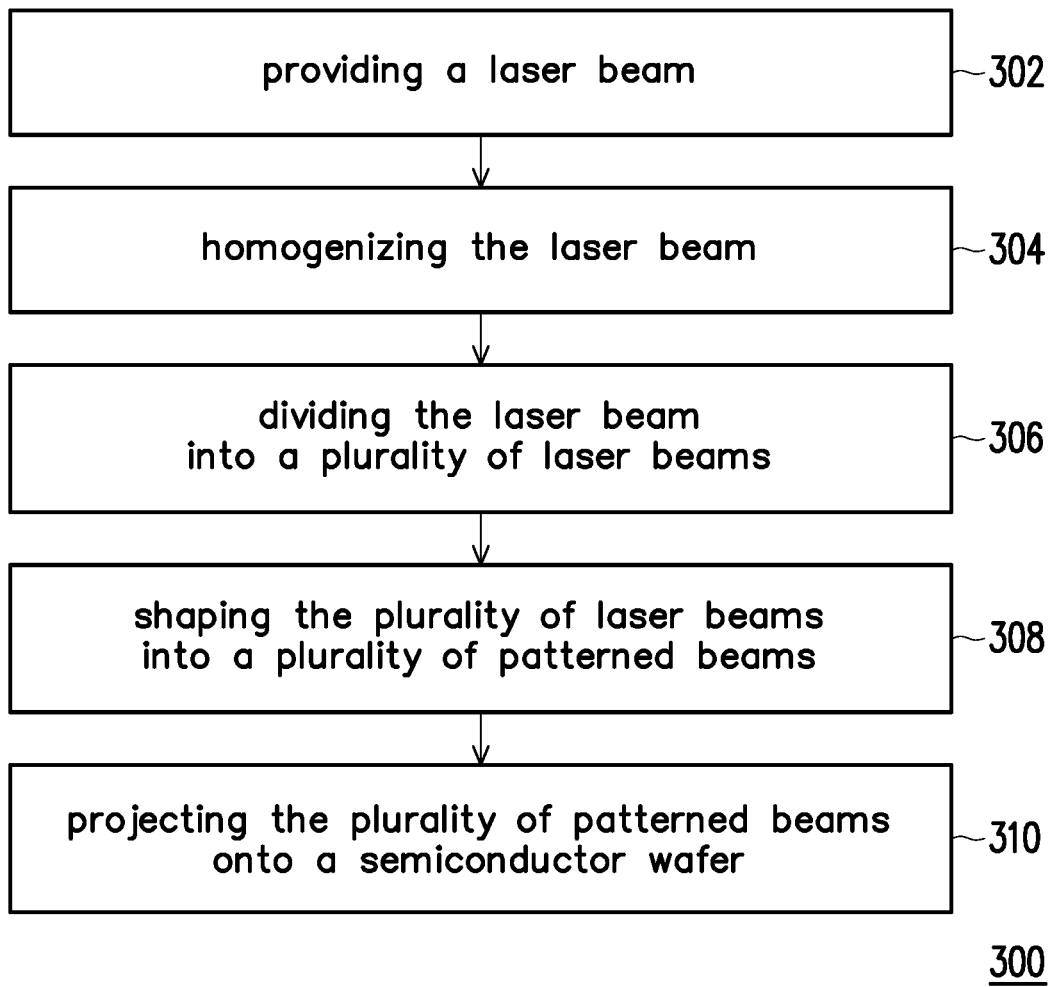
FIG. 6 is a flow chart of a method for forming alignment marks in accordance with some embodiments.

FIG. 6 is a flow chart of a method 300 for forming alignment marks in accordance with some embodiments. Although the method 300 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 302, a laser beam is provided. FIG. 2 illustrates the light source 210 configured to provide the laser beam LB. In some embodiments, the laser beam LB is an excimer laser beam. In some embodiments, the laser beam LB is provided with a light intensity distribution similar to a Gaussian distribution, as shown in FIG. 3A.

At act 304, the laser beam is homogenized. FIG. 2 illustrates the homogenizer 250 configured to homogenize (or uniformize) the laser beam LB. In some embodiments, after the laser beam LB is homogenized, the laser beam LB has a light intensity distribution similar to a top-hat distribution, as shown in FIG. 3B. In some embodiments, the laser beam LB is homogenized by a rod integrator. In some embodiments, the laser beam LB is homogenized by a diffractive optical element (DOE).

At act 306, the laser beam is divided into a plurality of laser beams. FIG. 2 illustrates the beam splitting element 220 configured to divide the laser beam LB into the first laser beam LB1 and the second laser beam LB2 separated from each other. In some embodiments, the beam splitting element 220 allows half of the laser beam LB to pass through and reflects half of the laser beam LB, so that the light intensities of the first laser beam LB1 and the second laser beam LB2 are substantially the same.

In some embodiments, act 306 is performed after act 304. In some embodiments, act 306 is performed before act 304. For example, the laser beam LB emitted from the light source 210 is first divided into the first laser beam LB1 and the second laser beam LB2, then the first laser beam LB1 and the second laser beam LB2 are homogenized by a first homogenizer and a second homogenizer, respectively.

At act 308, the plurality of laser beams is shaped into a plurality of patterned beams. FIG. 2 illustrates the pattern shaping element 230 configured to shape the first laser beam LB1 and the second laser beam LB2 into the first patterned beam PB1 and the second patterned beam PB2 respectively. In some embodiments, the first patterned beam PB1 and the second patterned beam PB2 are shaped with patterns corresponding to the first alignment mark AM1 and the second alignment mark AM2. In some embodiments, the first laser beam LB1 and the second laser beam LB2 are shaped by a diffractive optical element (DOE). In some embodiments, the first laser beam LB1 and the second laser beam LB2 are shaped by a reticle.

At act 310, the plurality of patterned beams is projected onto a semiconductor wafer. FIG. 2 illustrates the projection lens 240 configured to project the first patterned beam PB1 and the second patterned beam PB2 onto the semiconductor wafer 10 to directly form the first alignment mark AM1 and the second alignment mark AM2. In some embodiments, the first patterned beam PB1 and the second patterned beam PB2 ablate the semiconductor wafer 10 to form the first alignment lines 110, the second alignment lines 120 and the central pattern 130 of each of the first alignment mark AM1 and the second alignment mark AM2 directly in the semiconductor wafer 10.

In view of the above, with the method of the embodiments of the disclosure, the first alignment mark AM1 and the second alignment mark AM2 are directly formed by a single laser process. Therefore, a photolithography process which includes various procedures such as photoresist coating, baking, exposing and developing operations, as well as etching and cleaning processes, for forming the alignment marks is not required. The method of forming the alignment marks in accordance with some embodiments of the disclosure is a photolithography-free process. As a result, the process of manufacturing the alignment marks is simplified and the manufacturing cost is reduced.

The above embodiments in which the apparatus and the method are provided to form alignment marks are provided for illustration purposes, and are not construed as limiting to the present disclosure. In some embodiments, the apparatus and the method are provided to form other marks, such as a wafer identification (ID). In some embodiments, the alignment marks and the wafer identification of a wafer are manufactured simultaneously by a single laser exposure and melting process.

In accordance with some embodiments of the present disclosure, a method for forming alignment marks includes operations. A laser beam is provided. The laser beam is divided into a plurality of laser beams separated from each other. The plurality of laser beams is shaped into a plurality of patterned beams, so that the plurality of patterned beams is shaped with patterns corresponding to alignment marks. The plurality of patterned beams is projected onto a semiconductor wafer.

In accordance with alternative embodiments of the present disclosure, a method for forming alignment marks includes operations. A light source is provided to emit a laser beam. A beam splitter is provided to divide the laser beam into a first laser beam and a second laser beam traveling in different directions. A reflecting element is provided to redirect one of the first laser beam and the second laser beam, so that the first laser beam and the second laser beam travel in the same direction. A pattern shaping element is provided to shape the first laser beam and the second laser beam into a first patterned beam and a second patterned beam, wherein patterns of the first patterned beam and the second patterned beam correspond to alignment marks. A projection lens is provided to project the first patterned beam and the second patterned beam onto a semiconductor wafer to directly form the alignment marks.

In accordance with yet alternative embodiments of the present disclosure, an apparatus includes a light source, a beam splitting element, a pattern shaping element and a projection lens. The light source is configured to emit a laser beam. The beam splitting element is configured to divide the laser beam into a plurality of laser beams separated from each other. The pattern shaping element is configured to shape the plurality of laser beams into a plurality of patterned beams. The projection lens is configured to project the plurality of patterned beams onto a semiconductor wafer to form a plurality of alignment marks.

In accordance with yet alternative embodiments of the present disclosure, an alignment mark includes two sets of first alignment lines, and two sets of second alignment lines. The two sets of first alignment lines are arranged in a first direction and disposed diagonally symmetrical to a central pattern. The two sets of second alignment lines are arranged in a second direction different from the first direction and disposed diagonally symmetrical to a central pattern. The first and second alignment lines have tapered ends.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming alignment marks, comprising:
   providing a laser beam;
   dividing the laser beam into a plurality of laser beams separated from each other by passing the laser beam through a reticle;
   shaping the plurality of laser beams into a plurality of patterned beams having patterns shaped corresponding to the alignment marks; and
   projecting the plurality of patterned beams directly onto a semiconductor wafer, so as to simultaneously form a plurality of alignment marks in the semiconductor wafer,
   wherein each of the plurality of alignment marks has alignment lines with tapered end portions from a top view.

2. The method according to claim 1, wherein the method is a photolithography-free process.

3. The method according to claim 1, wherein the plurality of laser beams are shaped by a different reticle.

4. The method according to claim 1, wherein the plurality of laser beams is shaped by a diffractive optical element (DOE).

5. The method according to claim 1, further comprising:
   homogenizing the laser beam prior to dividing the laser beam into the plurality of laser beams.

6. The method according to claim 5, wherein after the laser beam is homogenized, the laser beam has a top-hat intensity distribution.

7. The method according to claim 1, wherein each of the plurality of laser beams has substantially identical light intensity.

8. The method according to claim 1, further comprising: removing by-products from the semiconductor wafer.

9. A method for forming alignment marks, comprising:
providing a light source to emit a laser beam;
providing a beam splitter to divide the laser beam into a first laser beam and a second laser beam traveling in different directions, wherein providing the beam splitter comprises providing a reticle;
providing a reflecting element to redirect at least one of the first laser beam or the second laser beam, so that the first laser beam and the second laser beam travel in the same direction;
providing a pattern shaping element to shape the first laser beam and the second laser beam into a first patterned beam and a second patterned beam, wherein patterns of the first patterned beam and the second patterned beam correspond to alignment marks; and
providing a projection lens to project the first patterned beam and the second patterned beam onto a semiconductor wafer to directly form the alignment marks.

10. The method according to claim 9, further comprising:
providing a homogenizer to homogenize the laser beam prior to providing the beam splitter to divide the laser beam into the first laser beam and the second laser beam.

11. The method according to claim 9, wherein a light intensity of the first laser beam is substantially equal to a light intensity of the second laser beam.

12. The method according to claim 9, wherein the method is a chemical-free process.

13. The method according to claim 9, further comprising:
providing a pump to remove by-products accompanying the formation of the alignment marks out of the semiconductor wafer.

14. A method for forming alignment marks, comprising:
providing a plurality of laser beams;
patterning the plurality of laser beams into a plurality of patterned beams; and
projecting the plurality of patterned beams directly onto a semiconductor wafer, so as to simultaneously form a plurality of alignment marks in the semiconductor wafer, wherein each of the plurality of alignment marks comprises: two sets of first alignment lines arranged in a first direction and disposed diagonally symmetrical to a central pattern; and two sets of second alignment lines arranged in a second direction different from the first direction and disposed diagonally symmetrical to the central pattern,
wherein projecting the plurality of patterned beams directly onto the semiconductor wafer produces the first and second alignment lines having tapered end portions from a top view.

15. The method according to claim 14, wherein the plurality of alignment marks are defined by a photolithography-free process.

16. The method according to claim 14, wherein the first and second alignment lines have residues protruding from sidewalls thereof.

17. The method according to claim 14, wherein an included angle between each of the first and second alignment lines and a top surface of the semiconductor wafer is in a range of about 30 degrees to about 75 degrees.

18. The method according to claim 14, wherein patterning the plurality of laser beams into the plurality of patterned beams comprises using a reticle.

19. The method according to claim 14, wherein patterning the plurality of laser beams into the plurality of patterned beams comprises using a diffractive optical element (DOE).

20. The method according to claim 14, further comprising removing by-products from the semiconductor wafer with a pump.

* * * * *